US011306913B2

(12) United States Patent
Taniguchi

(10) Patent No.: US 11,306,913 B2
(45) Date of Patent: Apr. 19, 2022

(54) STORAGE TANK, AND MATERIAL VAPORIZATION DEVICE AND LIQUID MATERIAL SUPPLY DEVICE PROVIDED WITH STORAGE TANK

(71) Applicant: HORIBA STEC, Co., Ltd., Kyoto (JP)

(72) Inventor: Shinji Taniguchi, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 187 days.

(21) Appl. No.: 16/467,707

(22) PCT Filed: Dec. 12, 2017

(86) PCT No.: PCT/JP2017/044549
§ 371 (c)(1),
(2) Date: Jun. 7, 2019

(87) PCT Pub. No.: WO2018/110545
PCT Pub. Date: Jun. 21, 2018

(65) Prior Publication Data
US 2020/0003409 A1 Jan. 2, 2020

(30) Foreign Application Priority Data
Dec. 14, 2016 (JP) .............................. JP2016-242745

(51) Int. Cl.
*F22B 3/02* (2006.01)
*F17C 7/04* (2006.01)
*H01L 21/00* (2006.01)

(52) U.S. Cl.
CPC .................. *F22B 3/02* (2013.01); *F17C 7/04* (2013.01); *H01L 21/00* (2013.01)

(58) Field of Classification Search
CPC .......... B65D 1/00; B65D 23/00; B65D 27/00; B65D 81/00; B67D 1/00; B67D 2210/00
See application file for complete search history.

(56) References Cited

U.S. PATENT DOCUMENTS

| 3,951,300 A | 4/1976 | Kalasek | |
|---|---|---|---|
| 8,939,314 B1 * | 1/2015 | Stahlberger | F17C 1/14 220/581 |

(Continued)

FOREIGN PATENT DOCUMENTS

| CN | 2856692 Y | 1/2007 |
|---|---|---|
| CN | 101893089 A | 11/2010 |

(Continued)

OTHER PUBLICATIONS

China National Intellectual Property Administration, Office Action and Search Report Issued in Application No. 2017800771307, dated Sep. 2, 2020, 16 pages.

(Continued)

*Primary Examiner* — Jermele M Hollington
*Assistant Examiner* — Temilade S Rhodes-Vivour
(74) *Attorney, Agent, or Firm* — Alleman Hall Creasman & Tuttle LLP

(57) ABSTRACT

The present invention is a storage tank including: a tank; a tank main body that stores a liquid material; a cover body that covers an opening of the tank main body; a support body that is positioned opposite to the cover body; a seal body that is sandwiched by a flange provided at the opening end of the tank main body and the cover body; and tightening members that tighten the cover body and the support body, and is capable of, even when the thickness of the flange provided at the opening end of the tank main body is thin, attaching the cover body on the flange while maintaining a contact property.

11 Claims, 6 Drawing Sheets

(56) References Cited

U.S. PATENT DOCUMENTS

| | | | | |
|---|---|---|---|---|
| 2005/0269234 | A1* | 12/2005 | Gore | B65D 81/00 |
| | | | | 206/524 |
| 2006/0144843 | A1 | 7/2006 | Vandal et al. | |
| 2006/0243751 | A1* | 11/2006 | Takeda | B67D 7/0272 |
| | | | | 222/394 |
| 2009/0200318 | A1* | 8/2009 | Handa | F17C 7/00 |
| | | | | 220/586 |
| 2010/0282753 | A1 | 11/2010 | Williams et al. | |
| 2017/0030521 | A1* | 2/2017 | Markham | F17C 3/005 |

FOREIGN PATENT DOCUMENTS

| | | |
|---|---|---|
| CN | 203163942 U | 8/2013 |
| CN | 103775826 A | 5/2014 |
| CN | 203975535 U | 12/2014 |
| CN | 204323937 U | 5/2015 |
| JP | 58146764 A | 9/1983 |
| JP | S59126994 U1 | 8/1984 |
| JP | H06006982 U | 1/1994 |
| JP | H08200956 A | 8/1996 |
| JP | 2010506429 A | 2/2010 |
| JP | 2011112196 A | 6/2011 |
| JP | 5159672 B2 | 3/2013 |
| JP | 5323654 B2 | 10/2013 |
| WO | 2008045972 A2 | 4/2008 |

OTHER PUBLICATIONS

China National Intellectual Property Administration, Office Action and Search Report Issued in Application No. 201780077130.7, dated Apr. 2, 2021, 24 pages.

ISA Japan Patent Office, International Search Report Issued in International Application No. PCT/JP2017/044549, dated Mar. 13, 2018, WIPO, 4 pages.

Korean Intellectual Property Office, Office Action Issued in Application No. 10-2019-7015858, dated Jan. 3, 2022, 13 pages.

* cited by examiner

STORAGE TANK, AND MATERIAL VAPORIZATION DEVICE AND LIQUID MATERIAL SUPPLY DEVICE PROVIDED WITH STORAGE TANK

TECHNICAL FIELD

The present invention relates to a storage tank, and a material vaporization device and a liquid material supply device provided with the storage tank.

BACKGROUND ART

Semiconductor manufacturing processes include one in which a liquid material supplied from a liquid material supply device is vaporized by a material vaporization device and led out to a chamber, and one in which a solid material is vaporized by a material vaporization device and led out to a chamber, and as a material storage tank of each device used in these semiconductor manufacturing processes, Patent Literature 1 discloses one including: a tank main body that stores a material; and a cover body that covers an opening of the tank main body, and having a structure to tighten a flange and the cover body by placing the cover body on the flange provided at the opening end of the tank main body and tightening tightening members passed through through-holes penetrating through the flange and the cover body.

However, in the material storage tank disclosed in Patent Literature 1 above, if the thickness of the flange is thin, the flange is deformed by tightening the tightening members, which causes the problem of being unable to maintain the contact property of the cover body with the flange, and only a tank main body provided with a flange having a certain level of thickness can be used.

Meanwhile, since a tank main body used for a conventional material storage tank for semiconductor manufacturing processes is structured by bending multiple plate materials made of metal or the like along the outer shape of the tank main body and mutually welding the multiple plate materials to connect them together, on the inner surface thereof, welding traces extending in a direction to intersect with the liquid level of a liquid material inevitably remain and the lower parts of the welding traces are in a state of being constantly exposed to the liquid material, so that there has been the problem that corrosion starts from here to reduce the strength of the tank main body. In addition, there has also been the problem that when the corrosion starts, corroded parts peel off from the inner surface of the tank main body and are mixed in material gas as particles to adversely affect respective devices connected to the downstream side of the tank.

Therefore, in order to eliminate welding traces caused when shaping a tank main body and extending in the up-down direction with respect to the liquid level of a liquid material while suppressing manufacturing cost, the applicant has attempted a method that stretches a plate material along the outer shape of the tank main body for shaping; however, the tank main body shaped by such a method has faced the problem of inevitably making the thickness of a flange thin to fail to use the structure to attach the cover body on the flange, which is employed by the material storage tank disclosed in Patent Literature 1 above.

CITATION LIST

Patent Literature

[Patent Literature 1]
Japanese Patent No. 5323654

SUMMARY OF INVENTION

Technical Problem

Therefore, the main problem of the present invention is to, even when the thickness of a flange provided at an opening edge of a tank main body is thin, attach a cover body on the flange while maintaining a contact property.

Solution to Problem

That is, a storage tank according to the present invention includes: a tank main body that stores a storage object consisting of at least any one or both of liquid and a solid; a cover body that covers an opening of the tank main body; a support body that is positioned opposite to the cover body; and a tightening member that tightens the cover body and the support body, in which the tank main body is provided with a flange at an opening end thereof, and the cover body and the support body are tightened by the tightening member in a state of sandwiching the flange.

In such a configuration, even when the thickness of the flange is thin, the sealability between the tank main body and the cover body can be maintained without deforming the flange. Accordingly, as the tank main body, one shaped by stretching a plate material made of metal or the like to make the thickness of the flange thin can also be used, and as a result, the tank main body becomes difficult to corrode.

Also, the storage tank may be one such that the cover body and the support body are tightened by the tightening member on the outer side than the outer edge of the flange.

In such a configuration, a tightening force by the tightening member is not locally applied to the flange, and as a result, a tightening force by the cover body and the support body can be substantially uniformly applied to the entire flange to improve the degree of sealing of the cover body with respect to the flange.

Further, the storage tank may be one such that the tightening member is a screw protruding from a position on the outer side than the outer edge of the flange in any one of the cover body and the support body, the other of the cover body and the support body is provided with a screw hole to be inserted with the screw, and the cover body and the support body are tightened by tightening of the screw into the screw hole.

In such a configuration, even when the thickness of the flange is thin, the sealability between the flange and the cover body can be maintained to be high without processing the flange having low strength. Also, only by changing the degree of tightening of the screw, the sealability of the cover body with respect to the flange can be easily adjusted.

Still further, any of the above-described storage tanks may be one further including a seal body that is sandwiched by the cover body and the flange.

Yet further, the storage tank including the seal body may be one further including a spacer that is sandwiched by the cover body and the support body, in which the spacer is thicker than the thickness of the flange and thinner than a thickness obtained by adding the thickness of the seal body in a non-pressurized state to the thickness of the flange, and further, in the surface opposite to the flange, the cover body has a holding groove that holds the seal body.

In such a configuration, the seal body can be prevented from being exceedingly squashed in a pressurized state, and also when the flange is tightened by the cover body and the support body, the circumferential surface of the flange can be tightened with uniform force. Further, the displacement of the seal body with respect to the flange and the cover body can be prevented.

Any of the above-described storage tanks may be one such that the tank main body is integrally shaped.

In such a configuration, no welding trace remains on the inner surface of the tank main body, and therefore corrosion resistance to material is remarkably improved to extend a durable period.

Also, a material vaporization device including any of the above-described storage tanks may be one including: a heater that heats the storage object stored in the tank main body; a lead-out pipe that is provided to the cover body to lead gas produced by vaporizing the storage object out of the tank main body; and a flow rate control device that is connected to the lead-out pipe.

Further, a liquid material supply device including any of the above-described storage tanks may be one including a lead out pipe that is provided to the cover body to lead the storage object consisting of liquid out of the tank main body.

Advantageous Effects of Invention

According to the present invention, even when the thickness of the flange provided at the opening end of the tank main body is thin, the cover body can be attached on the flange while maintaining a contact property.

BRIEF DESCRIPTION OF DRAWINGS

FIG. 5 is a cross-sectional view illustrating a tank main body of a material vaporization device according to another embodiment.

LIST OF REFERENCE CHARACTERS

Figure 1:
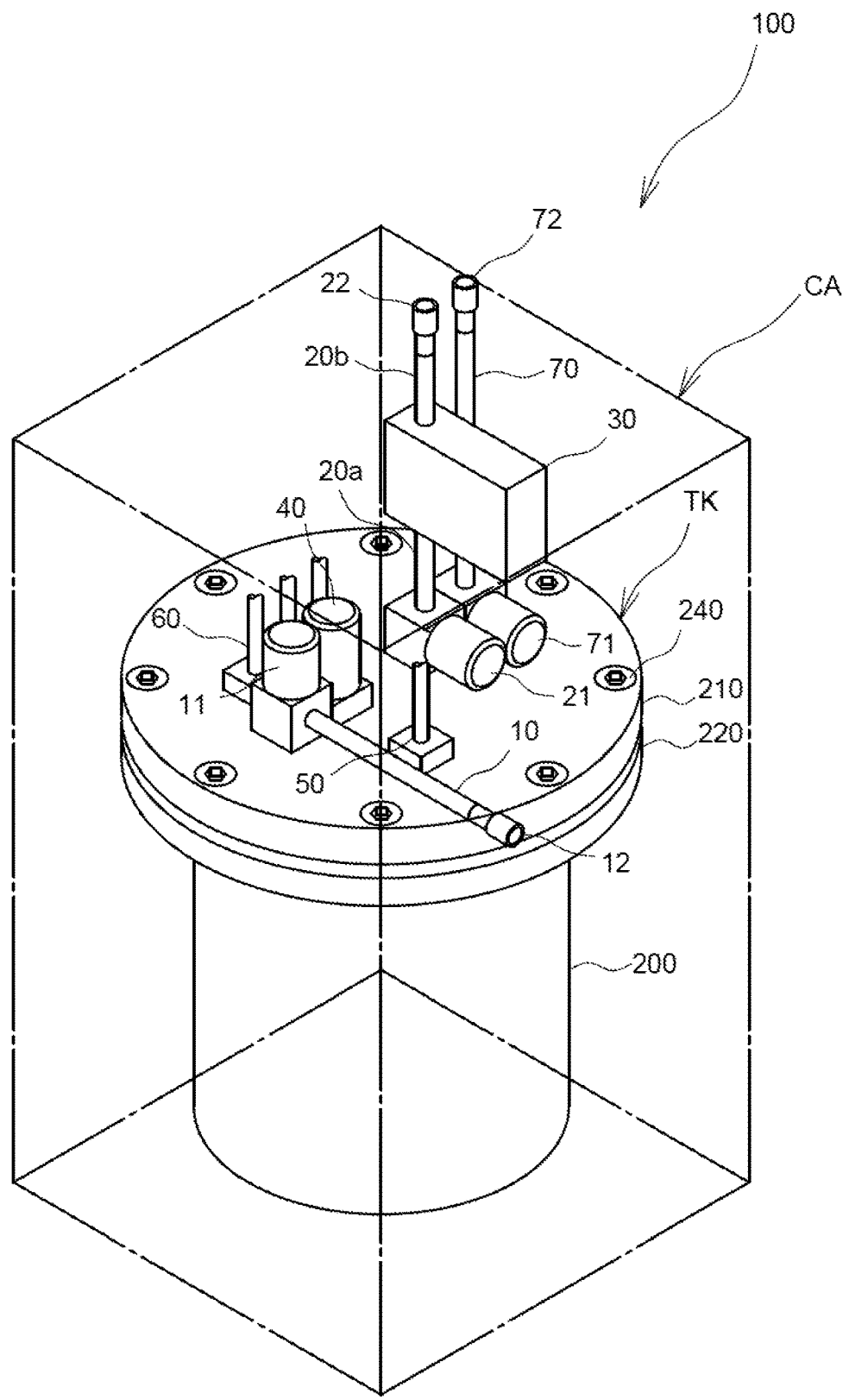
FIG. 1 is a perspective view illustrating a material vaporization device according to an embodiment.

100 Material vaporization device
TK Tank
200 Tank main body
210 Cover body
220 Support body
230 Seal body
240 Tightening member
250 Spacer

DESCRIPTION OF EMBODIMENTS

In the following, the material vaporization device according to the present invention will be described with reference to the drawings.

A material vaporization device 100 of the present embodiment is one that is used in, for example, semiconductor manufacturing processes, and that vaporizes a material to produce material gas, and sends the material gas to target equipment such as a chamber. The material vaporization device 100 of the present embodiment can be used for any of a solution vaporization method and a bubbling method. In addition, the semiconductor manufacturing processes include manufacturing processes for semiconductor devices, liquid crystals, solar panels, optical fibers, and the like.

Figure 2:
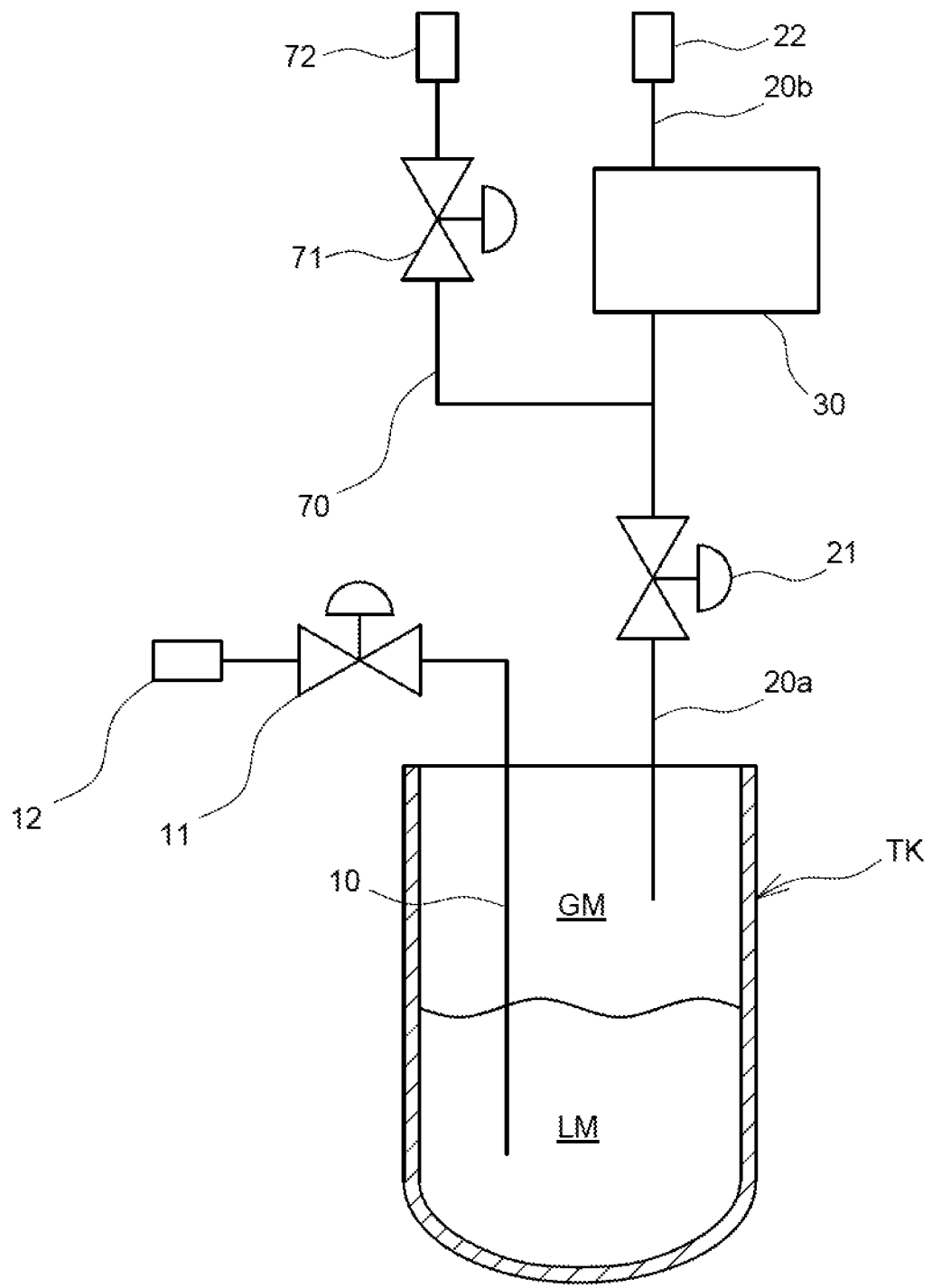
FIG. 2 is a schematic diagram schematically illustrating the material vaporization device according to the embodiment.

As illustrated in FIG. 1 or FIG. 2, the material vaporization device 100 of the present embodiment includes: a tank TK (storage tank) that stores a liquid material LM; an introduction pipe 10 for supplying the liquid material LM to the tank TK; a first lead-out pipe 20a and second lead-out pipe 20b for, from the tank TK, leading out material gas GM produced by vaporizing the liquid material LM; a flow rate control device 30 that controls the flow rate of the material gas GM flowing in from the first lead-out pipe 20a to lead out it to the second lead-out pipe 20b; a pressure measuring device 40 that measures the pressure inside the tank TK; a temperature measuring device 50 that measures the temperature inside the tank TK; a liquid level measuring device 60 that measures the height of the liquid level LM of the liquid material LM inside the tank TK; a heater (not illustrated) for heating the tank TK; and a case CA for accommodating them (indicated by a one-dot chain lines in FIG. 1). In addition, as for the introduction pipe 10, the first lead-out pipe 20a, the second lead-out pipe 20b, the pressure measuring device 40, the temperature measuring device 50, and the liquid level measuring device 60, in FIG. 3 and FIG. 4 illustrating the structure of the tank TK, these members are omitted and not illustrated.

Figure 3:
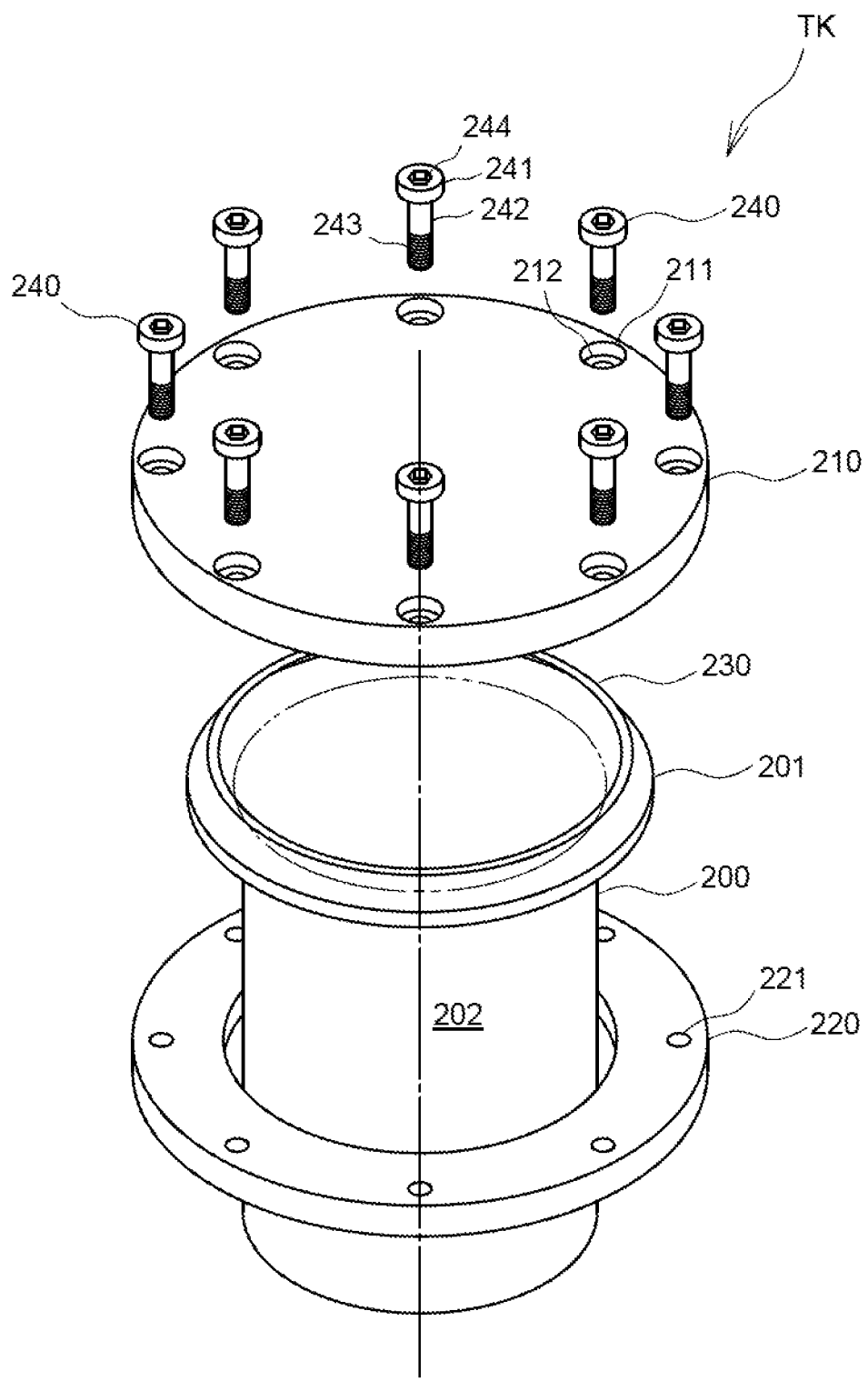
FIG. 3 is an exploded perspective view illustrating a tank of the material vaporization device according to the embodiment.
Figure 4:
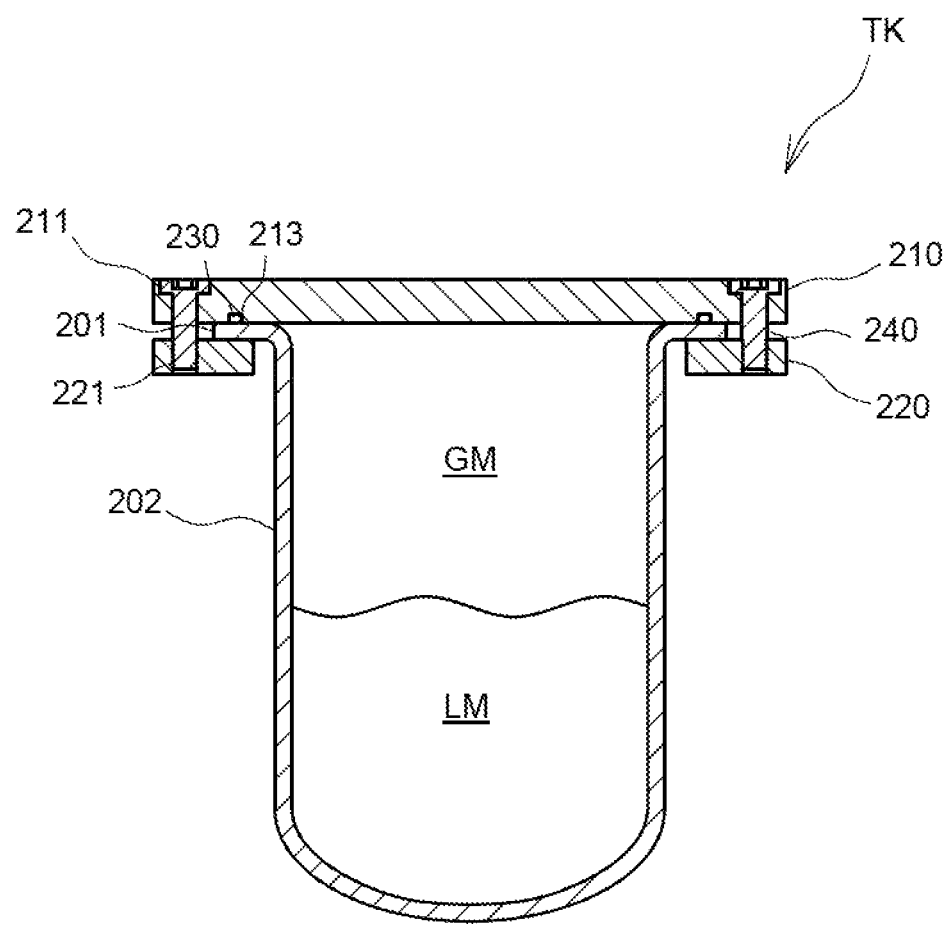
FIG. 4 is a cross-sectional view illustrating the tank of the material vaporization device according to the embodiment.

As illustrated in FIG. 3 and FIG. 4, the tank TK includes: a tank main body 200 that stores the liquid material LM; a cover body 210 that covers an opening of the tank main body 200; a support body 220 positioned opposite to the cover body 210; a seal body 230 that is sandwiched by a flange 201 provided at the opening end of the tank main body 200 and the cover body 210; and tightening members 240 that tighten the cover body 210 and the support body 220.

The tank main body 200 is one integrally shaped by stretching a plate material made of metal or the like, and includes a columnar-shaped body 202 having a bottomed hole that opens on a predetermined surface. Further, the tank main body 200 is provide with the flange 201 curvedly extending outward from the opening end of the body 202. The flange 201 has a circular-shaped outer shape. In addition, the flange 201 is an annular-shaped one extending outward from the opening end of the body 202. Also, preferably, the flange 201 is one having a shape along the same plane.

The cover body 210 is formed of a relatively thick plate material made of metal or the like, and disk-shaped. Further, the cover body 210 has a larger outside diameter than the flange 201 provided to the tank main body 200. Also, in the cover body 210, multiple through-holes 211 for inserting the tightening members 240 are provided arranged along the outer circumference at regular intervals. In addition, the openings of these through-holes 211 on the outer surface (upper surface) side are adapted to be large in diameter as compared with the openings on the inner surface (lower surface) side, and in doing so, steps 212 are provided on the inner surfaces of the through-holes 211. Also, the cover body 210 is provided with a holding groove 213 for holding the seal body 230 on the surface opposite to the flange 201. In addition, the holding groove 213 has a depth shallower than the thickness of the seal body 230 in a non-pressurized state. Incidentally, the introduction pipe 10, first lead-out pipe 20a, pressure measuring device 40, temperature measuring device 50, and liquid level measuring device 60 are all connected to the outer surface of the cover body 210.

The support body 220 is formed of a relatively thick plate material made of metal or the like, and ring-shaped. Further, the inside diameter of the support body 220 is adapted to be larger in diameter than the body 202 of the tank main body 200 and smaller in diameter than the flange 201. In doing so, the support body 220 is adapted to be in contact with the flange 201 in a state where the body 202 of the tank main body 200 is passed there through. Also, the support body 220 is provided with multiple screw holes 221 opposite to the respective through-holes 211 of the cover body 210.

The seal body 230 is formed of an elastic material made of metal, resin, rubber, or the like, and ring-shaped.

The tightening members 240 are so-called bolts. Further, the tightening members 240 include a columnar-shaped heat part 241 and a shaft body 242 extending from the head part 241, and the fore end of the shaft body 242 is provided with a screw groove 243. Also, the head part 241 is provided with a hexagonal hole 244 insertable with a hexagonal wrench.

In addition, the tank TK is structured to allow the cover body 210 and the support body 220 to tighten the flange 201 by bringing the cover body 210 into close contact with the flange 201 of the tank main body 200 so as to cover the opening, as well as bringing the support body 220 into close contact with the flange 201 from the body 202 side of the tank main body 200, inserting the tightening members 240 into the respective through-holes 211 of the cover body 210, and inserting the screw grooves 243 provided in the shaft bodies 242 of them into the screw holes 221 of the support body 220 to perform tightening. Further, in this state, the seal body 230 fitted into the holding groove 213 of the cover body 210 is pressurized and deformed by coming into contact with the flange 201, and this allows the sealability between the cover body 210 and the flange 201 to be ensured. Also, the tightening members 240 are adapted to protrude from the through-holes 211 positioned on the outer side than the outer edge of the flange 201 in the cover body 210 toward the support body 220 in such a manner as to avoid the flange 201, and be inserted into the screw holes 221 of the support body 220. In doing so, a tightening force by the tightening members 240 is transmitted to the flange 201 via the cover body 210 and the support body 220, and therefore no force is locally applied to the flange 201, preventing deformation even when the thickness of the flange 201 is thin, Next, the respective equipment connected to the cover body 210 of the tank TK will be described.

The introduction pipe 10 and the first lead-out pipe 20a are both connected to the cover body 210 and connect into the tank TK. In addition, the introduction pipe 10 and the first lead-out pipe 20a are respectively provided with on-off valves 11, 21. The on-off valves 11, 21 are adapted to open any one or both appropriately depending on the situation, and introduce the liquid material LM supplied from a liquid material supply device to the tank TK or lead out the material gas GM produced by the vaporization of the liquid material LM from the tank TK. In addition, one end of the introduction pipe 10 protrudes outside the case CA, and the one end is provided with a connection port 12. Further, the connection port 12 of the introduction pipe 10 is connected to a connection pipe extending from the liquid material supply device. Also, the second lead-out pipe 20b extends from the first lead-out pipe 20a via the flow rate control device 30. In addition, one end of the second lead-out pipe 20b protrudes outside the case CA, and the one end is provided with a connection port 22. Further, the connection port 22 of the second lead-out pipe 20b is connected to a connection pipe extending from the target equipment.

The flow rate control device 30 is a so-called mass flow controller. In addition, the flow rate control device 30 includes: a measuring mechanism that measures the flow rate of the material gas GM sent from the first lead-out pipe 20a; and an opening/closing mechanism that controls the opening level of a flow path on the basis of the measured flow rate measured by the measuring mechanism so that the flow rate of the material gas GM to be send to the second lead-out pipe 20b becomes equal to a predetermined flow rate.

Also, from between the on-off valve 21 in the first lead-out pipe 20a and the flow rate control device 30, a purge pipe 70 branches, and the purge pipe 70 is also provided with an on-off valve 71. In addition, one end of the purge pipe 70 protrudes outside the case CA, and the one end is provided with an inlet port 72. Further, the purge pipe 70 is used when purging the flow rate control device 30, and when performing the purge, the on-off valve 21 is closed, and purge gas is introduced from the inlet port 72, passed through the flow rate control device 30, and discharged from the connection port 22 through the second lead-out pipe 20b.

The pressure measuring device 40, temperature measuring device 50, and liquid level measuring device 60 are all inserted into the tank TK through the cover body 210. In addition, the pressure measuring device 40 is a so-called pressure sensor, and one that measures the pressure inside the tank TK. Also, the temperature measuring device 50 is a so-called platinum resistance thermometer (Pt sensor), and one that measures the temperature inside the tank TK. Further, the liquid level measuring device 60 can use various types such as a heat capacity type (one that, for example, makes a resistor through which a constant current is flowed serve as a sensor main body, makes the resistor generate heat at, for example, higher temperature than a surrounding environment, and senses the height of a liquid level from a change in resistance value occurring as a result of the occurrence of a change in the temperature of the resistor between when the resistor is in gas and when it is immersed in liquid, which is caused by the difference in specific heat between both) and other types including a float type, ultrasonic type, electrostatic capacitance type, pressure type, and vibration type, and is one that measures the liquid level of the liquid material LM stored in the tank TK.

The heater is one that heat the material stored in the tank main body, and for example, a jet heater, tape heater, cartridge heater, rubber heater, or the like can be used.

In addition, the material vaporization device 100 includes an unillustrated control part. The control part is one that includes a CPU, a memory, an A/D converter, a D/A converter, and the like, and is configured to fulfill a function as the control part by making the CPU and peripheral devices cooperate in accordance with a program stored in a predetermined area of the memory. Specifically, it is adapted to control the heater on the basis of the temperature inside the tank TK measured by the temperature measuring device 50 so that the temperature inside the tank TK becomes equal to a predetermined temperature, and also control the on-off valve 11 provided in the introduction pipe 10 on the basis of the height of the liquid level inside the tank TK measured by the liquid level measuring device 60 so that the height of the liquid level of the liquid material LM stored in the tank TK becomes equal to a predetermined height.

Other Embodiments

Figure 5A:
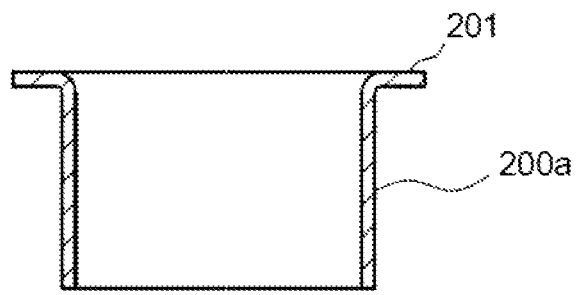
FIGS. 5(a) and 5(b) are cross-sectional views illustrating a tank main body of a material vaporization device according to another embodiment.
Figure 5A:
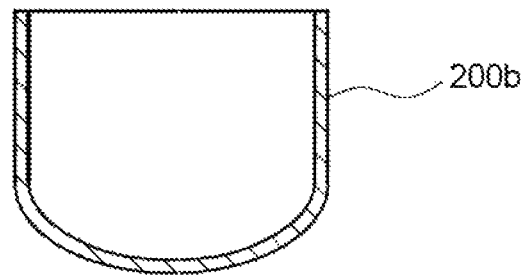
Figure 5B:
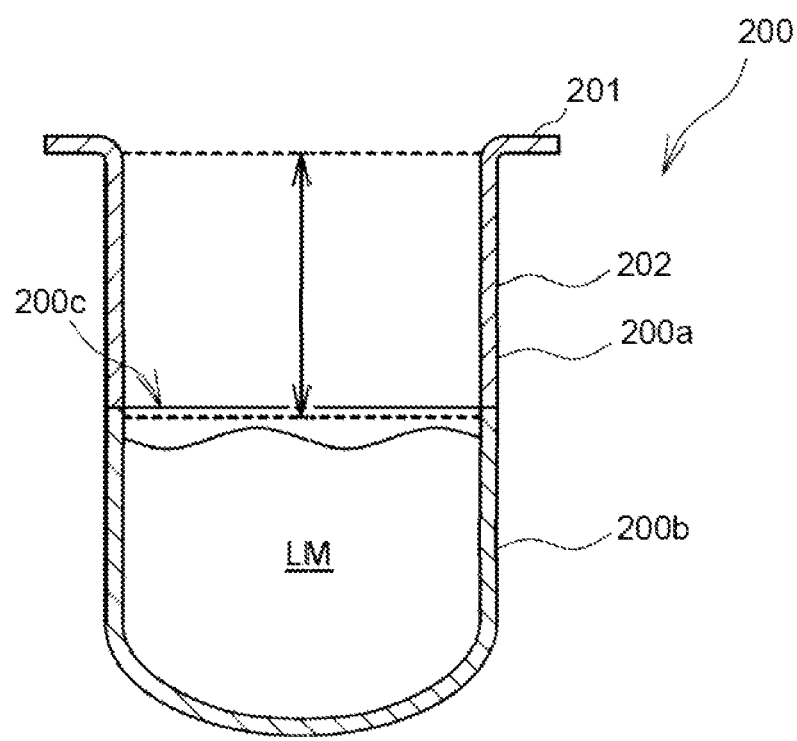

In the above-described embodiment, the tank main body 200 is integrally shaped by stretching the plate material, but may be one in which two or more members are joined together. That is, as illustrated in FIGS. 5(a) and 5(b), when forming the tank main body 200, two members consisting of a member 200a formed with a flange by curving an opening end of a pipe material on one side and a columnar-shaped member 200b that is formed by stretching a plate material and has a bottomed hole opening on a predetermined surface are first prepared, and these are joined together by welding with one 200a of the members as the opening side of the tank main body 200 and the other member 200b as the bottom side of the tank main body 200. In doing so, a welding trace 200c is in a state of extending substantially parallel to the liquid level of the liquid material LM stored in the tank main body 200, and by positioning the position of the welding trace 200c above the liquid level, the welding trace 200c is prevented from being constantly exposed to the liquid material LM. Accordingly, even in such a tank main body 200, the welding trace 200c can be prevented from being constantly exposed to the liquid material LM and early corroded. In addition, the welding trace 200c of the tank main body 200 is only required to be positioned above the liquid level of the liquid material LM stored in the tank main body 200 as indicated by an arrow in FIG. 5(b), and is preferably only required to be positioned at the boundary between the flange 201 and the body 202, which is the most separated position from the liquid level.

Figure 6:
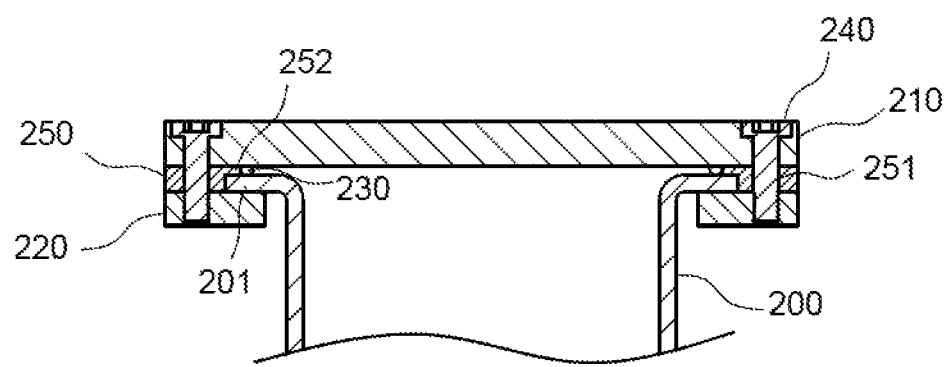
FIG. 6 is a partial cross-sectional view illustrating a tank of a material vaporization device according to another embodiment.

Also, in the above-described embodiment, the shape of the seal body 230 at the time of pressurization is controlled by the depth of the holding groove 213 provided in the surface of the cover body 210 opposite to the flange 201; however, as illustrated in FIG. 6, the shape of the seal body 230 in a pressurized state may be controlled by a spacer 250 sandwiched between the cover body 210 and the support body 220. In addition, in this case, the spacer 250 has a ring-shaped part having a larger inside diameter than the outside diameter of the flange 201, and the part is provide with multiple through-holes 251 opposite to the respective through-holes 211 of the cover body 210. Also, the thickness of the spacer 250 in this part is set to be thicker than the thickness of the flange 201, and thinner than a thickness obtained by adding the thickness of the seal body 230 in the non-pressurized state to the thickness of the flange 201. Further, by providing a holding step 252 formed by, with one surface of the spacer 250 in contact with the support body 220 as with the flange 201, extending a part of the other surface, specifically, a part of the inner surface protruding from the flange 201 in this state between the cover body 210 and the flange 201, the seal body 230 can be positioned by the holding step 252. In addition, FIG. 6 illustrates an embodiment in which the holding step 252 is provided as the spacer 250; however, an embodiment in which the spacer 250 does not include the holding step 252 is also possible.

Further, in the above-described embodiment, the cover body 210 and the support body 220 are tightened by tightening of the tightening members 240; however, the cover body 210 and the support body 220 may be sandwiched by a clamp and thereby tightened.

Also, in the above-described embodiment, as the support body 220, the ring-shaped one is used; however, as the support body 220, one divided into multiple pieces may be used.

Still further, the tank TK according to the above-described embodiment can also be used as a tank of the liquid material supply device that supplies the liquid material LM to the material vaporization device 100. In addition, in this case, it is only necessary to connect a gas introduction pipe for, into the tank TK, introducing gas for regulating the internal pressure thereof, and a liquid lead-out pipe for leading the liquid material LM out of the tank TK and sending it to the liquid material supply device respectively to the cover body 210.

Further, a material to be stored in the material storage tank used for the material vaporization device of the present invention and for semiconductor manufacturing processes may be a solid material.

INDUSTRIAL APPLICABILITY

According to the present invention, even when the thickness of the flange provided at the opening end of the tank main body is thin, the cover body can be attached on the flange while maintaining a contact property.

The invention claimed is:

1. A storage tank comprising:
a tank main body that is made of metal and stores a storage object consisting of at least any one or both of liquid and a solid;
a cover body that covers an opening of the tank main body;
a support body that has a ring shape and is positioned opposite to the cover body; and
a tightening member that tightens the cover body and the support body, wherein
the tank main body is provided with a flange at an opening end thereof, and
the cover body and the support body are tightened by the tightening member in a state of sandwiching the flange.

2. The storage tank according to claim 1, wherein the cover body and the support body are tightened by the tightening member on an outer side than an outer edge of the flange.

3. The storage tank according to claim 2, wherein the tightening member protrudes from the outer side than the outer edge of the flange in any one of the cover body and the support body,
the other of the cover body and the support body is provided with a hole to be inserted with the tightening member, and
the cover body and the support body are tightened by tightening of the tightening member into the hole.

4. The storage tank according to claim 1, further comprising
   a seal body that is sandwiched by the cover body and the flange.

5. The storage tank according to claim 4, further comprising
   a spacer that is sandwiched by the cover body and the support body, wherein
   the spacer is thicker than a thickness of the flange, and thinner than a thickness obtained by adding a thickness of the seal body in a non-pressurized state to the thickness of the flange.

6. The storage tank according to claim 4, wherein
   the cover body has a holding groove in a surface opposite to the flange, the holding groove holding the seal body.

7. The storage tank according to claim 1, wherein
   the tank main body is integrally shaped.

8. A material vaporization device comprising the storage tank according to claim 1, the material vaporization device comprising:
   a heater that heats the storage object stored in the tank main body;
   a lead-out pipe that is provided to the cover body to lead gas produced by vaporizing the storage object out of the tank main body; and
   a flow rate control device that is connected to the lead-out pipe.

9. A liquid material supply device comprising the storage tank according to claim 1, the liquid material supply device comprising
   a lead out pipe that is provided to the cover body to lead the storage object consisting of liquid out of the tank main body.

10. The storage tank according to claim 1, wherein the support body is formed as one ring.

11. The storage tank according to claim 1, wherein the support body is formed from a plurality of parts.

* * * * *